United States Patent [19]

Shavers

[11] Patent Number: 4,624,337

[45] Date of Patent: Nov. 25, 1986

[54] SPEAKER ENCLOSURE

[76] Inventor: Glynn S. Shavers, 22 Hosmer St., Mattapan, Mass. 02126

[21] Appl. No.: 782,991

[22] Filed: Oct. 2, 1985

[51] Int. Cl.[4] .......... H05K 5/00

[52] U.S. Cl. .......... 181/145; 181/147; 181/155; 181/199; 381/89; 381/90

[58] Field of Search .......... 181/144, 145, 147, 152, 181/154-156, 199; 381/24, 88-90

[56] References Cited

U.S. PATENT DOCUMENTS

| | | | |
|---|---|---|---|
| 2,050,575 | 8/1936 | Krause | 181/155 |
| 2,623,606 | 12/1952 | Corke | 181/154 |
| 3,688,864 | 9/1972 | Guss | 181/145 X |

*Primary Examiner*—Benjamin R. Fuller

[57] ABSTRACT

This speaker enclosure is of such design and structure, as to increase the input handling of speakers, enabling speakers rated at forty watts maximum handling, for example, to handle approximately eighty watts, which will facilitate the use of more of the sophisticated quality engineered into an excellent amplifier. Primarily, the enclosure employs a woofer, two mid-range speakers helped out by a ten inch horn, and two tweeters, and the speakers of the same frequency handling capacity, are wired in series. This arrangement covers the full audio frequency spectrum, and all of the speakers are crossed over by an adjustable cross-over.

4 Claims, 3 Drawing Figures

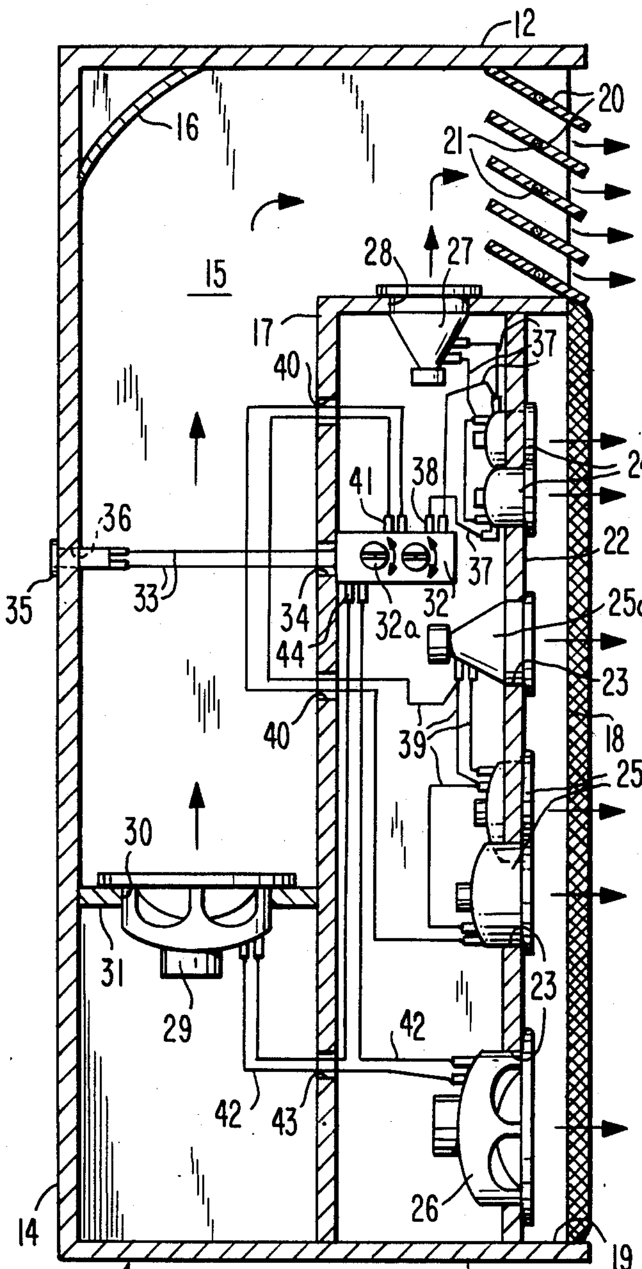
FIG. 2
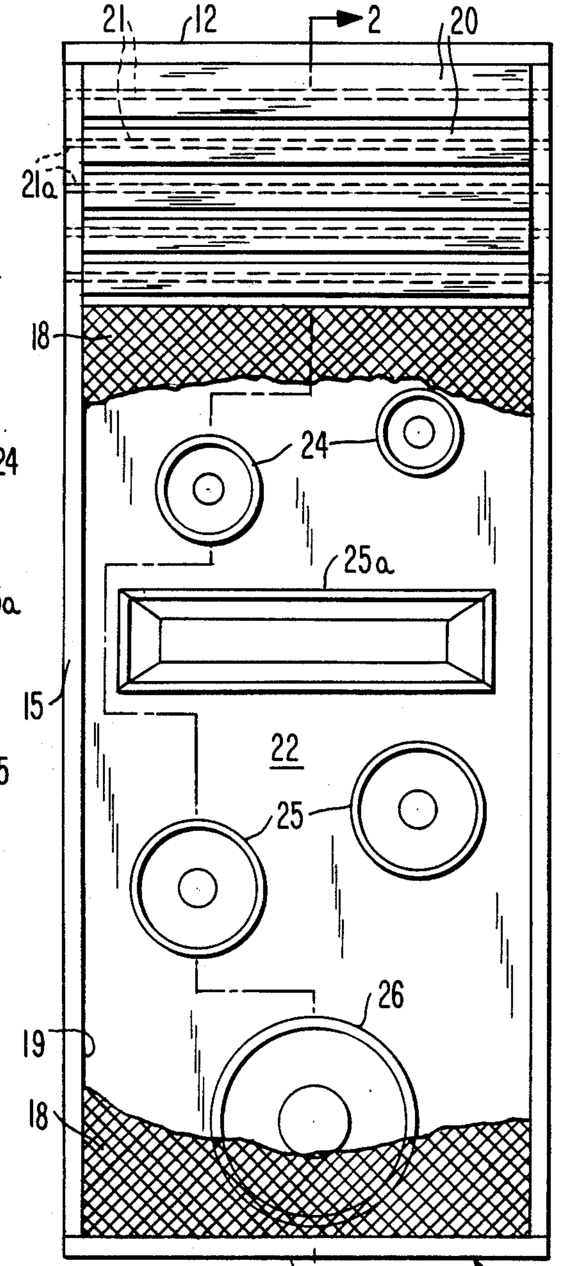
FIG. 1
FIG. 3
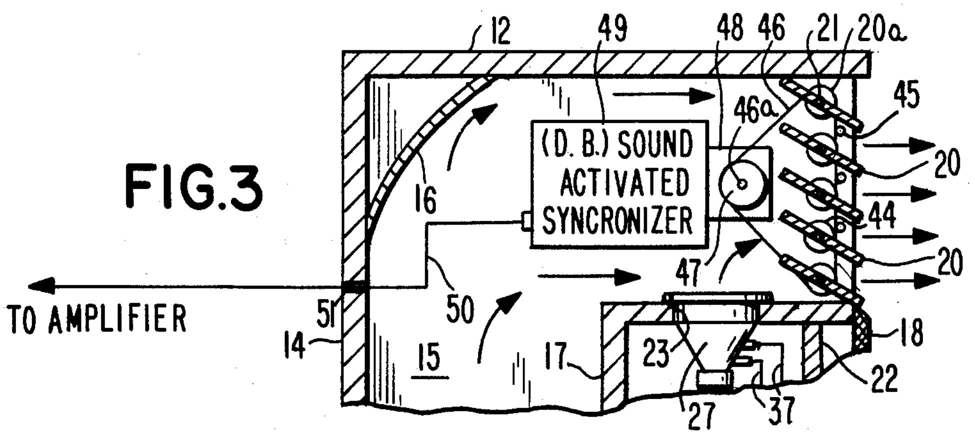

SPEAKER ENCLOSURE

BACKGROUND OF THE INVENTION

1. Field of the Invention

This invention relates to audio systems. More specifically, it relates to a speaker enclosure for audio frequency improvement.

2. Description of Prior Art

Conventional speaker enclosures of good quality, usually employ a woofer, mid-range, and tweeter elements for high efficiency deliverance of sound, and there are many designs of such for audio systems. The speaker enclosure in accordance with the present invention, is of such design, as to increase the input handling capacity for utilizing the sophisticated audio capability that is engineered into a good amplifier.

It is the object of this invention to provide a speaker enclosure, which will have its front section somewhat conventional, with the exception, that speakers of the same frequency are wired in series to increase the input handling capacity, thus, if a component is rated at forty watts maximum handling capacity, it may now handle approximately eighty watts. In this manner, one can use more of the so-called color that is engineered into an excellent amplifier.

Another object of this invention is to provide a speaker enclosure, which will employ one woofer, two mid-range speakers helped out by a ten inch horn, and two tweeters, all being crossed-over by an adjustable cross-over, and this arrangement will cover the full audio spectrum.

The uniqueness of this arrangement is that one woofer is secured in the rear section of the huge enclosure, near the bottom, and is wired in series with a second woofer in the front section of the enclosure. Although the rear section is isolated from the front, a column of air and sound waves are driven up and into a baffle or deflector in the corner, and this pushes the sound waves from straight out the front, pushing before it, the lighter high frequency sound waves from a tweeter horn aimed straight within the top of the enclosure. This sound is also aimed for height in the listening area, by adjustable louvers.

What is accomplished by such a unique and novel design, is that the unit makes the percussion or the high's seem closer to the listener and more realistic than conventional speaker systems, and this is of great importance for this kind of deflecting and tonal quality.

BRIEF DESCRIPTION OF THE DRAWINGS

FIG. 1 is a front elevational view of the present invention;

FIG. 2 is a cross-sectional view, taken along the line 2—2 of FIG. 1, and

FIG. 3 is a fragmentary view, similar to FIG. 2, illustrating a modified form of louver design.

SUMMARY OF THE INVENTION

This enclosure is designed to increase the input handling capacity of speakers, enabling speakers rated at forty watts maximum handling, to handle approximately eighty watts, thus utilizing more of the quality built into a good amplifier. The above is accomplished by a two woofers, two mid-range speakers helped out by a twelve inch horn, two tweeters, and a tweeter horn, and the speakers of the same frequency handling capacity, are wired in series.

DETAILED DESCRIPTION

Accordingly, an enclosure 10 is shown to include a housing 11, having a top wall 12, a bottom wall 13, a rear wall 14, and a pair of side walls 15, all of which are fabricated of wood preferably. A concave baffle 16 is provided and is suitably fixedly secured at its side edges, to top wall 12, rear wall 14, and side walls 15 on the interior of housing 11, for a purpose, which will hereinafter be described. An inverted "L"-shaped divider wall 17 is provided and fabricated of wood, as is also baffle 16, and the side peripheral edges of wall 17 are suitably fixedly secured to side walls 15, and one end is similarly secured to bottom wall 13 on the interior of housing 11. A suitable mesh grill 18 is suitably fixedly secured at its side peripheral edges within the front opening 19 of housing 11, but only covers the isolated front compartment defined by the divider wall 17, which leaves the top front portion of housing 11 open. A plurality of equally spaced and horizontal louvers 20 are received within the top front portion of housing 11, and are pivotally mounted by their respective shafts 21 within openings 21*a* in the side walls 15 of housing 11. Louvers 20 are adjustable for aiming sounds for elevation in the listening area, by manual means.

A front wall 22 is recessed three inches from the front of housing 11, and is fixedly secured in a suitable manner at its outer peripheral edges, to the bottom wall 13 of housing 11, the side walls of housing 11, and to the upper portion of divider wall 17. The dimensions of housing 11 are preferably four feet in height, twelve inches wide, and two feet deep. A plurality of openings 23 are provided through front wall 22, and a pair of tweeters 24, a pair of mid-range speakers 25, and a first woofer 26, are suitably secured therein. The pair of tweeters 24 for high frequency response, are spaced adjacent to each other in the upper portion of front wall 22, the mid-range speakers 24 are similarly arranged above the first woofer 26, which provides for low frequency response, and a mid-range horn 25*a* is also received in an opening 23, and is disposed between the tweeters 24 and the mid-range speakers 25. A high frequency tweeter horn 27 is secured in an opening 28 provided in the upper end of divider wall 17, and faces upward for intersecting its high frequency sound with the low frequency sound produced from a second woofer 29, which also faces upward in the rear compartment defined by divider wall 17, and second woofer 29 is mounted within an opening 30 provided through a support wall 31, which is suitably fixedly secured to divider wall 17, rear wall 14, and side walls 15. A cross-over unit 32 is also provided, and its input wires 33 extend through an opening 34 through divider wall 17. The connector jack 35 thereof, is mounted in an opening 36 provided through rear wall 14 of housing 11. Tweeters 24 and tweeter horn 27, are wired in series by wires 37, and are connected to the tweeter terminals 38 of the tweeter section of cross-over unit 32, which is adjustable by means of adjustment screws 32*a*, which is known in the art. The mid-range speakers 25 and the mid-range horn 25*a*, are also wired in series by wires 39, and a pair of same, extend through openings 40 through wall 17, and are secured to the mid-range terminals of cross-over unit 32. The first woofer 26 and the second woofer 29 are wired in series by means of wires 42 which extend through opening 43 and one of the openings 40 of wall 17, and are connected to the low frequency terminals 44 of cross-over unit 32.

In operation, the amplifier output jack 35 is first coupled to the output of the amplifier being used, which is not shown. The tweeters 24, the mid-range speakers 25, the mid-range horn 25*a*, and the first woofer 26, will deliver sound straight outward through the grill 18 when the amplifier is delivering its audio frequencies. At the same time, the second woofer 29 in the bottom and in the rear compartment of housing 11, will also produce the low frequencies in a vertical direction, the result being, that the upward travel of air and sound waves strike the baffle 16 and deflect the sound waves at right angles, out of the top front of the housing 11, pushing before them the lighter high frequency sound waves from the tweeter horn 27. Simultaneously, the high frequency sound waves being emitted from the tweeter horn 27, are also diverted at right angles. The louvers 20 are adjusted by manual rotation thereof, as desired, for height in the listening area, and thus, the percussion or the high's seem closer to the listener, and more realistic than was before possible.

Referring now to FIG. 3, louvers 20 are modified to include a timing pulley 20*a* fixedly secured to the shafts 21, and a plurality of idler pulleys 45 are suitably mounted in the side walls 15. An endless timing belt 46 is received on pulleys 20*a*, idler pulleys 45, and drive pulley 47, which is mounted to the shaft 46*a* of a servomotor 48 which is attached to a D.B. sound activated syncronizer 49 mounted to a side wall 15 by suitable fastening means, not shown. A power cable 50 of syncronizer 49, extends through an opening 51 of rear wall 14, and is coupled to the power current source of the amplifier, to feed current into 49, which by low frequency means, will actuate the attached servo-motor 48, that will rotate the modified louver arrangement.

In operation, the sound actuated 49 actuates the servo-motor 48, which will by the pulley and belt 46 means, close the louvers 20 in accordance with the D.B. output of the amplifier. The low frequency speaker D.B.'s, causes the louvers 20 to close in ratio to the low frequency and the high frequency tweeters working in the opposite direction.

While various changes may be made in the detail structure, such changes will be within the spirit and scope of the present invention as defined by the appended claims.

What I now claim is:

1. A speaker enclosure for an audio system, comprising, in combination, a housing and a plurality of speakers contained within said housing, said housing comprising a top wall, a bottom wall, a rear wall and a pair of opposite side walls, an inverted "L"-shaped divider wall therewithin having a vertical leg and a horizontal leg extending to a front edge of said housing to divide an interior of said housing into a front lower compartment and a rear compartment therebehind extending in an "L"-shaped thereabove, a front wall closing a front of said front lower compartment and a mesh grill spaced forwardly of said front wall, a plurality of equally spaced apart, horizontal louvers across a front opening of said rear compartment located above said grill, said louvers being pivotally mounted for selective vertically directly sound waves therebetween, a concave baffle across and closing an upper rear corner of said rear compartment, and edges of all said walls fixedly abutting those of said walls that are located adjacent thereto; said plurality of speakers comprising a pair of tweeters, a tweeter horn, a pair of mid-range speakers, a mid-range horn, a first woofer, a second woofer and a cross-over unit; a plurality of openings through said front compartment front wall, said pair of tweeters, said pair of mid-range speakers, said mid-range horn and said first woofer being mounted in said openings facing forwardly, an opening in said divider horizontal leg and said tweeter horn being mounted therein facing upwardly toward an upper forwardly extending portion of said rear compartment behind said louvers; a horizontal support wall in said rear compartment being spaced elevated from said bottom wall and including an opening in which said second woofer is mounted facing upwardly to deliver sound waves toward said baffle and thence forwardly past said tweeter horn toward said louvers and pushing before them high frequency sound waves produced by said tweeter horn.

2. The combination as set forth in claim 1, wherein said pair of tweeters and said tweeter horn are wired in series with each other and coupled to a pair of tweeter terminals of said cross-over unit, which is mounted to said divider wall, and the input cable of said cross-over unit includes a jack which is mounted in an opening through said rear wall, and said jack provides coupling means for said enclosure to the output of an amplifier, and said cable is also received through an opening provided in said divider

3. The combination as set forth in claim 2, wherein said pair of mid-range speakers and said mid-range horn are wired in series with each other, and are coupled to a pair of mid-range terminals provided on said cross-over unit.

4. The combination as set forth in claim 3, wherein said first woofer in said front compartment and said second woofer in said rear compartment, are wired in series with each other and are coupled to a pair of low frequency terminals provided on said cross-over unit, and said baffle is fixedly secured at its side peripheral edges, to said side walls, said rear wall, and said top wall, and deflects the low frequency sound waves from said second woofer at said right angles out of the opening in said front end of said enclosure.

* * * * *